United States Patent [19]

Fujima

[11] Patent Number: 5,276,360
[45] Date of Patent: Jan. 4, 1994

[54] REDUNDANT CONTROL CIRCUIT INCORPORATED IN SEMICONDUCTOR INTEGRATED CIRCUIT DEVICE FOR PRODUCING CONTROL SIGNAL INDICATIVE OF REPLACEMENT WITH REDUNDANT UNIT

[75] Inventor: Shiro Fujima, Tokyo, Japan
[73] Assignee: NEC Corporation, Japan
[21] Appl. No.: 910,646
[22] Filed: Jul. 8, 1992
[30] Foreign Application Priority Data Jul. 8, 1991 [JP] Japan .................. 3-166555

[51] Int. Cl.⁵ .............. G06F 11/16; H03K 19/007
[52] U.S. Cl. .................... 307/441; 307/449; 307/443; 365/200; 365/230.06
[58] Field of Search .............. 307/441, 449, 443; 365/200, 230.06, 203

[56] References Cited

U.S. PATENT DOCUMENTS

| | | | |
|---|---|---|---|
| 4,228,528 | 10/1980 | Cenker et al. | 365/200 |
| 4,614,883 | 9/1986 | Sood et al. | 307/449 |
| 4,689,494 | 8/1987 | Chen et al. | 307/441 |
| 4,714,839 | 12/1987 | Chung | 307/441 |
| 5,058,059 | 10/1991 | Matsuo et al. | 307/441 |
| 5,107,464 | 4/1992 | Sahara et al. | 365/200 |

Primary Examiner—Edward P. Westin
Assistant Examiner—Jon Santamauro
Attorney, Agent, or Firm—Ostrolenk, Faber, Gerb & Soffen

[57] ABSTRACT

A redundant control circuit compares a defective address with an external address to determine whether a redundant word line is driven for a read-out operation instead of a defective word line assigned as a defective address, and keeps a redundant control signal on a precharged output signal line at an active high voltage level in the presence of the external address consistent with the defective address. A precharging unit not only charges the output signal line to the active high voltage level before arrival of the external address but also keeps the output signal line at the active high voltage level even if a current path is undesirably established from the output signal line to a discharge line in the presence of the external address consistent with the defective address, thereby preventing the defective word line from being undesirably accessed.

4 Claims, 4 Drawing Sheets

REDUNDANT CONTROL CIRCUIT INCORPORATED IN SEMICONDUCTOR INTEGRATED CIRCUIT DEVICE FOR PRODUCING CONTROL SIGNAL INDICATIVE OF REPLACEMENT WITH REDUNDANT UNIT

FIELD OF THE INVENTION

This invention relates to a semiconductor integrated circuit device and, more particularly, to a redundant control circuit for producing a control signal indicative of replacement with a redundant unit.

DESCRIPTION OF THE RELATED ART

A redundant technology is attractive to semiconductor manufacturers, and is applied to ultra large scale integrated circuits for improvement of production yield. FIG. 1 shows a redundant control circuit incorporated in a prior art semiconductor memory device, and the redundant control circuit is used for replacement of a regular word line with a redundant word line when a defective memory cell is coupled with the regular word line. The prior art redundant control circuit largely comprises a programming circuit 1, a p-channel enhancement type precharging transistor Qp1 and a level retaining circuit 2. The programming circuit 1 comprises series combinations of fuse elements F1 to F14 and n-channel enhancement type switching transistors Qn11 to Qn24, and the series combinations are coupled in parallel between an output signal line OUT and a ground voltage line GND. Though not shown in FIG. 1, a row address signal is pre-decoded at a address pre-decoder unit so as to produce internal row address bits X1 to X7 and the complementary bits thereof CX1 to CX7. The internal address bits X1 to X7 and the complementary bits CX1 to CX7 are supplied through a row address decoder unit (not shown) to a word line driver unit (not shown) and directly to the programming circuit 1. The word line driver unit drives one of the word lines assigned the row address indicated by the row address signal in so far as any defective memory cell is not coupled with the selected word line.

On the other hand, the internal row address bits X1 to X7 are respectively supplied to the gate electrodes of the n-channel enhancement type switching transistors Qn11, Qn13, Qn15, Qn17, Qn19, Qn21 and Qn23, and the other n-channel enhancement type switching transistors Qn12, Qn14, Qn16, Qn18, Qn20, Qn22 and Qn24 are respectively gated by the complementary bits CX1 to CX7. The fuse elements F1 to F14 are selectively broken, and the broken fuse elements are indicative of a row address assigned to a word line replaced with a redundant word line. The row address signal consists of a string of external row address bits R1 to R7 each either logic "1" or "0", and the external row address bits of logic "1" level and the external row address bits of logic "0" level are respectively converted into the internal row address bits of logic "1" level and the complementary bits of logic "1" level, respectively. For this reason, the row address indicated by the row address signal can be compared with the row address stored by selectively breaking the fuse elements F1 to F14. Since a broken fuse element associated with an internal address bit of logic "1" corresponds to an external row address bit of logic "1" and a broken fuse element associated with a complementary bit of logic "1" corresponds to an external row address bit of logic "0", a combination of the broken fuse elements corresponds to a row address represented by the external row address signal. For example, if a word line coupled with a defective memory cell is assigned a row address indicated by the external row address bits R1 to R7 of (1011010), the fuse elements F1, F4, F5, F7, F10, F11 and F14 are broken.

Upon completion of the fabrication process sequence of the semiconductor memory device, the semiconductor memory device is subjected to a diagnosis to see if or not a defective memory cell is incorporated therein. If a defective memory cell is found, the regular word line coupled therewith is replaced with a redundant word line coupled with a row of redundant memory cells, and the row address assigned to the regular word line is stored in the programming circuit 1 by selectively breaking the fuse elements F1 to F14. After installation in an electronic system, the internal address bits X1 to X7 and the complementary bits CX1 to CX7 are supplied to the programming circuit 1 to see if or not an external device tries to access the data bit stored in the defective memory cell. If the word line replaced with the redundant word line is indicated by the external row address bits R1 to R7, the internal row address bits X1 to X7 and the complementary bits CX1 to CX7 are selectively shifted to logic "1" depending upon the external row address bits R1 to R7, and are supplied to the n-channel enhancement type switching transistors Qn11 to Qn24. Since the row address represented by the external row address bits R1 to R7 is consistency with the row address stored in the programming circuit 1, the internal row address bits and the complementary bits of logic "1" level are only supplied to the gate electrodes of the n-channel enhancement type switching transistors associated with the broken fuse elements, and any current path is never established from the output signal line OUT to the ground voltage line GND. However, if the row address indicated by the external row address bits R1 to R7 are inconsistency with the row address stored in the programming circuit 1, at least one n-channel enhancement type switching transistor associated with non-broken fuse element turns on, and a current path is provided from the output signal line OUT through the n-channel enhancement type switching transistor to the ground voltage line.

The p-channel enhancement type precharging transistor Qp1 is coupled between a source of positive power voltage level Vcc and the output signal line OUT, and is responsive to a precharge control signal PC. While semiconductor memory device stands idle, the precharge control signal PC remains in active low voltage level, and the output signal line OUT is charged from the positive power voltage source Vcc through the p-channel enhancement type precharging transistor Qp1. Upon access to a data bit stored in the prior art semiconductor memory device, the precharge control signal PC is recovered to the inactive high voltage level, and the current path through the p-channel enhancement type precharging transistor Qp1 is closed. After the p-channel enhancement type precharging transistor Qp1 is closed, the internal row address bits and the complementary bits are supplied to the programming circuit 1, and the programming circuit 1 either maintains or discharges the output signal line OUT depending upon the selected row address.

The level retaining circuit 2 comprises an inverting circuit 2a coupled with the output signal line OUT, and a p-channel enhancement type make-up transistor Qp2 coupled between the positive power voltage source Vcc and the output signal line OUT. The inverting circuit 2a produces an activation signal ACT of the low voltage level when the row address bits R1 to R7 are indicative of the stored row address and, accordingly, the output signal line OUT is maintained in the high voltage level. The activation signal ACT is supplied to the gate electrode of the p-channel enhancement type make-up transistor Qp2, and the p-channel enhancement type make-up transistor Qp2 turns on so as to maintain the high voltage level on the output signal line OUT. However, in case of inconsistency with the stored row address, the output signal line OUT goes down to the low voltage level, and the inverting circuit 2a supplies the high voltage level to the gate electrode of the p-channel enhancement type make-up transistor Qp2. With the positive high voltage level, the p-channel enhancement type make-up transistor Qp2 is turned off, and no current flows into the output signal line OUT. The p-channel enhancement type make-up transistor Qp2 is smaller in current driving capability than the n-channel enhancement type switching transistors Qn11 to Qn24 in view of current consumption.

If the output signal line OUT is kept in the high voltage level, a redundant control signal RS of the high voltage level is supplied to a redundant word line driver (not shown) associated with the redundant word line as well as to the word line driver associated with the regular word line replaced with the redundant word line. With the redundant control signal RS of the high voltage level, the redundant word line driver is activated to drive the redundant word line. However, the word line driver is disabled, and the word line is never driven to the active level.

The redundant control circuit thus arranged is liable to be affected by noise on the ground voltage line or the positive power voltage line Vcc. Namely, noise is causative of voltage fluctuation, and the voltage fluctuation tends to allow one of the n-channel enhancement type switching transistor associated with non-broken fuse element to turn on. When the n-channel enhancement type switching transistor associated with non-broken fuse element turns on, the output signal line OUT is grounded therethrough, and the inverting circuit 2a causes the p-channel enhancement type make-up transistor Qp2, because the p-channel enhancement type make-up transistor Qp2 is too small in current driving capability to supplement the discharging current passing through the n-channel enhancement type switching transistor unintentionally turned on. Even if the noise is removed and, accordingly, the n-channel enhancement type switching transistor turns off again, both p-channel enhancement type precharging and make-up transistors Qp1 and Qp2 are kept off, and the output signal line OUT remains in the low voltage level. Thus, the output signal line OUT is unintentionally kept in the low voltage level, and the word line coupled with the defective memory cell is driven for access instead of the redundant word line.

SUMMARY OF THE INVENTION

It is therefore an important object of the present invention to provide a redundant control circuit which is less susceptible to voltage fluctuation due to noise.

To accomplish the object, the present invention proposes to allow a precharging transistor to turn on while a redundant control signal is in active level.

In accordance with the present invention, there is provided a redundant control circuit associated with a redundant component circuit replaceable with a defective component circuit, comprising a) a programming unit storing an address assigned to the defective component circuit, and operative to compare the address with an external address to see whether or not the defective component circuit is selected, the programming unit blocking an output signal line from a discharge line for shifting a redundant control signal on the output signal line to active level when the external address is in consistency with the address stored therein, the programming unit providing a current path from the output signal line and the discharge line when the external address is in inconsistency with the address for shifting the redundant control signal to inactive level; b) a precharging unit operative to charge the output signal line to the active level before reaching the external address to the programming unit, and maintaining the active level on the output signal line even if a current path is established between the output signal line and the discharge line in the presence of the external address in consistency with the address; and c) a make-up unit operative to make up current to the output signal line when the output signal line is in the inactive level.

BRIEF DESCRIPTION OF THE DRAWINGS

The features and advantages of the redundant control circuit according to the present invention will be more clearly understood from the following description taken in conjunction with the accompanying drawings in which.

DESCRIPTION OF THE PREFERRED EMBODIMENT

Figure 1:
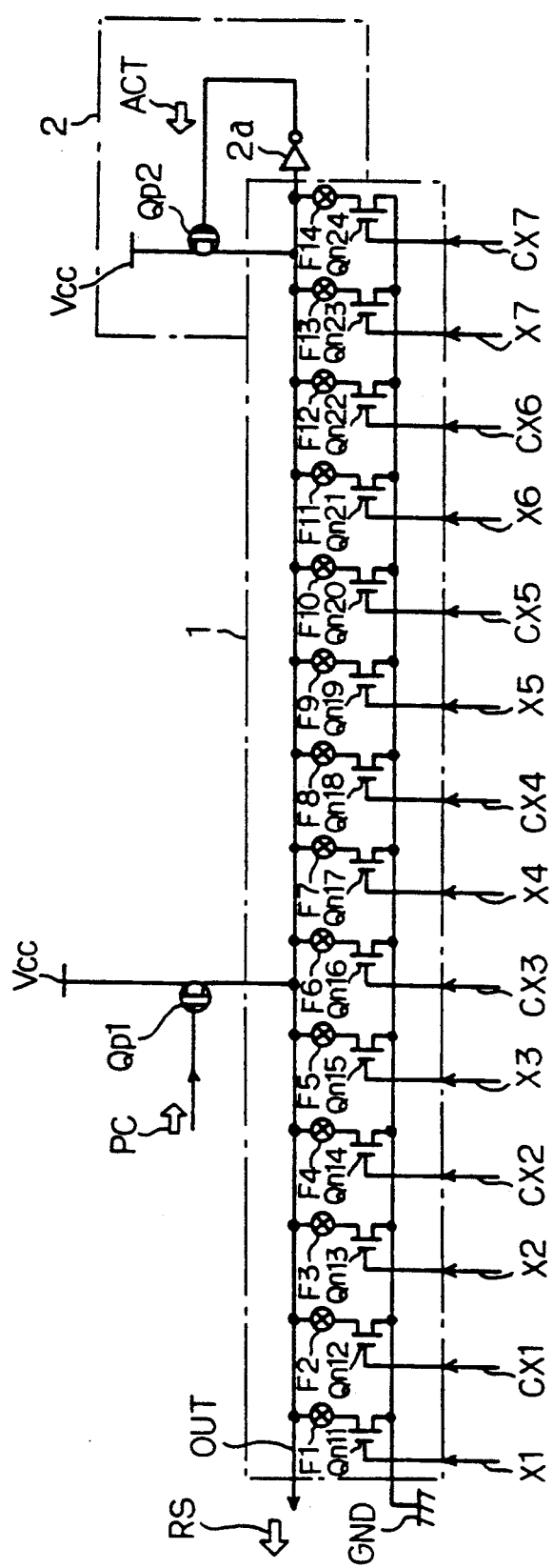
FIG. 1 is a circuit diagram showing the prior art redundant control circuit incorporated in the semiconductor memory device.
Figure 2:
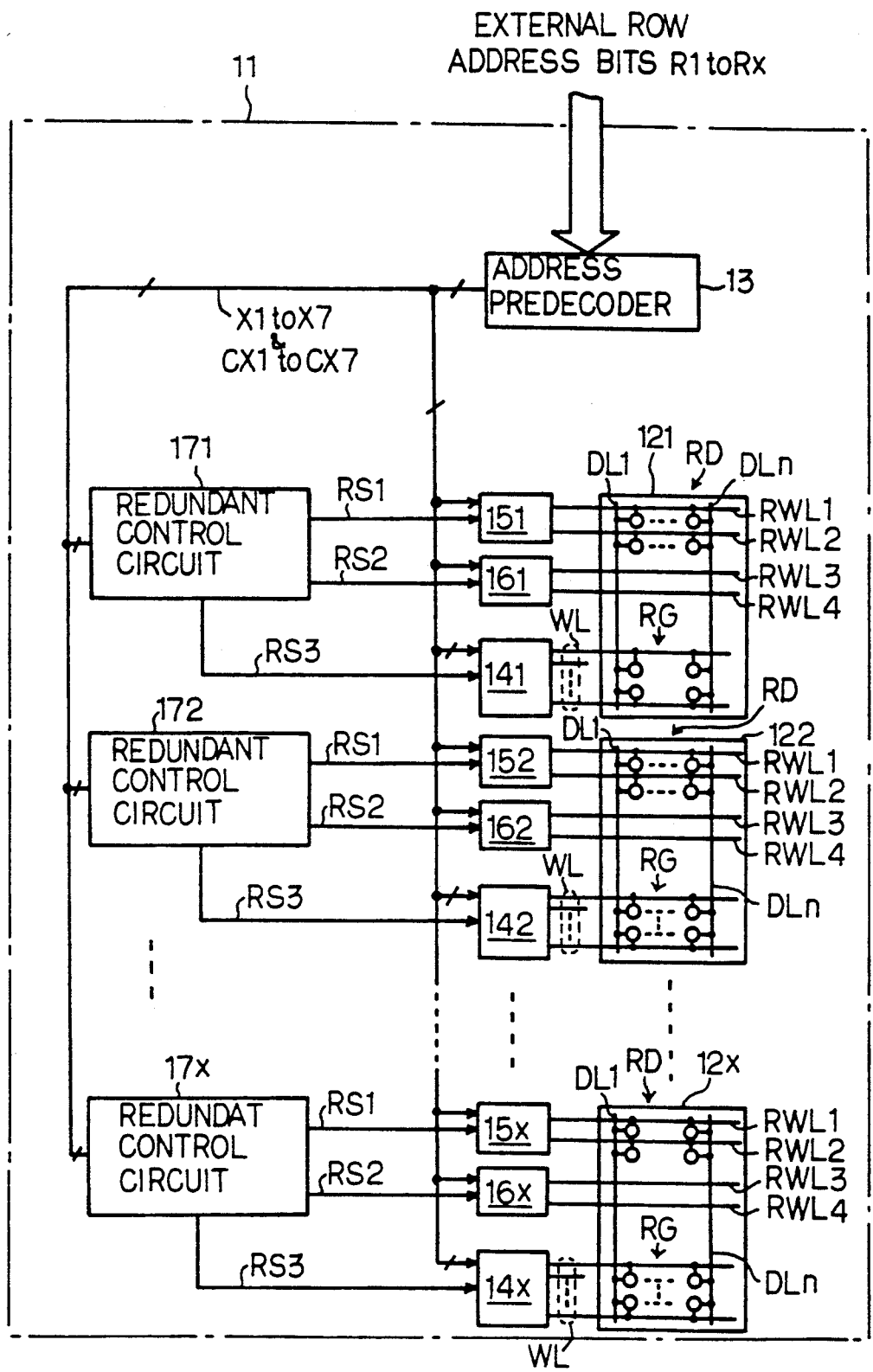
FIG. 2 is a block diagram showing the circuit arrangement of a semiconductor memory device equipped with a redundant control circuit according to the present invention.

Referring to FIG. 2 of the drawings, essential circuit components of a semiconductor memory device is fabricated on a single semiconductor chip 11, and comprises a memory cell array 12 broken down into a plurality of memory cell sub-arrays 121, 122, ... and 12x, an address predecoder 13, a plurality of row address decoder/regular word line driver units 141, 142, ... and 14x respectively associated with the memory cell sub-arrays 121 to 12x, row address decoder/ first redundant word line driver units 151, 152, ... and 15x associated with the memory cell subarrays 121 to 12x, row address decoder/ second redundant word line units 161, 162, ... and 16x also associated with the memory cell sub-arrays 121 to 12x, and redundant control circuits 171, 172, ... and 17x coupled with the row address decoder/ first redundant word line driver units 151 to 15x as well as with the row address decoder/ second redundant word line driver units 161 to 16x, respectively. Although the semiconductor memory device further comprises other component units such as, for example, sense amplifier circuits, a block decoder unit, a column address decoder unit, a column selector and a data input-/output unit, these component units are not shown in FIG. 2 for the sake of simplicity.

Each of the memory cell sub-arrays 121 to 12x is implemented by regular memory cells RG arranged in rows and columns and redundant memory cells RD also arranged in rows and columns. A plurality of bit lines DL1 to DLn are shared between the regular memory cells RG and the redundant memory cells RD, and are, accordingly, coupled with the columns of the regular memory cells RG and the memory cell sub-arrays 121 to 12x is further associated with regular word lines WL and redundant word lines RWL1, RWL2, RWL3 and RWL4. The regular word lines WL are coupled with the rows of the regular memory cells RG, and the redundant word lines RWL1 to RWL4 are respectively coupled with the rows of the redundant memory cells RD. The regular word lines WL are selectively driven by the associated row address decoder/regular word line driver unit 141, 142, ... or 14x, and allows the associated regular memory cells to be coupled with the associated bit lines DL1 to DLn. However, the redundant word lines RWL1 and RWL2 are selectively driven by the row address decoder/first redundant word line driver unit 151, 152, ... or 15x, and the redundant word lines RWL3 and RWL4 are selectively driven by the row address decoder/ second redundant word line driver unit 161, 162, ... or 16x. When one of the redundant word lines RWL1 to RWL4 is driven by the associated redundant word line driver unit, the row of the redundant memory cells are coupled with the associated bit lines DL1 to DLn.

External row address bits R1 to Rx are supplied to the row address predecoder unit 13, and produces internal row address bits X1 to Xx identical in logic level with the corresponding external row address bits R1 to Rx and the complementary bits CX1 to CXx opposite in logic level to the corresponding external row address bits R1 to Rx. The internal address bits X1 to Xx and the complementary bits CX1 to CXx are supplied to the row address decoder/regular word line driver units 141 to 14x, and one of the internal row address bits X1 to Xx, usually the least significant bit, is supplied to the row address decoder/ first redundant word line driver units 151 to 15x and the row address decoder/ second redundant word line driver units 161 to 16x. Those driver units 141 to 14x, 151 to 15x and 161 to 16x are selectively enabled with redundant control signals RS1, RS2 and RS3 supplied from the associated redundant control circuit 171, 172, ... or 17x. If one of the redundant control signals RS1 and RS2 is in active high voltage level, the other redundant control signal RS3 remains in inactive low voltage level. However, if both of the redundant control signals RS1 and RS2 go down to inactive low voltage level, the redundant control signal RS3 is lifted to the active high voltage level.

Figure 3:
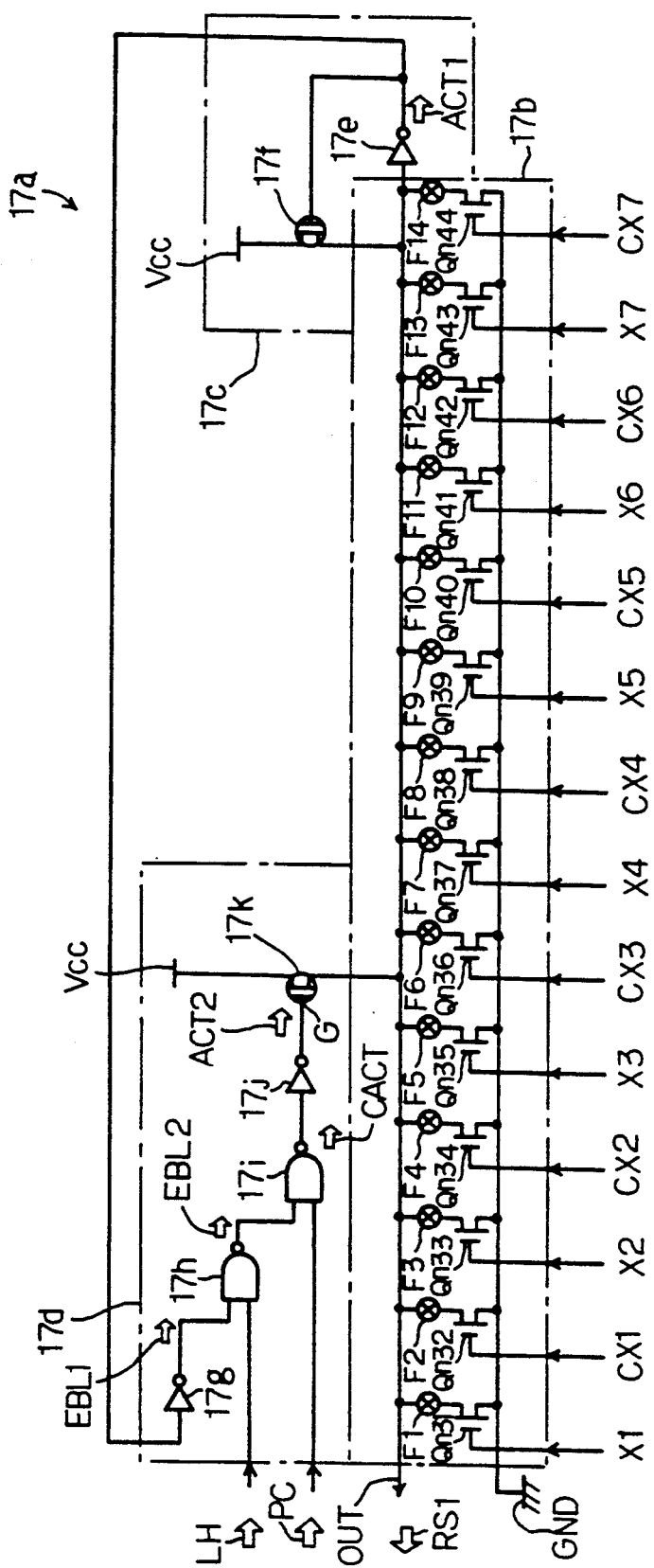
FIG. 3 is a circuit diagram showing the circuit arrangement of the redundant control circuit incorporated in the semiconductor memory device shown in FIG. 2.

Each of the redundant control circuits 171 to 17x has two redundant control sub-circuits 17a for producing the redundant control signals RS1 and RS2, and one of the redundant control sub-circuits 17a is illustrated in FIG. 3 in detail. The redundant control signal RS3 is, by way of example, produced through NOR operation on the redundant control signals RS1 and RS2. The internal row address bits X1 to X7 selected from the bits X1 to Xx and the complementary bits CX1 to CX7 are supplied to all of the redundant control sub-circuits 17a. In this instance, the least significant Xx and the complementary bit thereof CXx is not supplied to the redundant control sub-circuits 17a.

The redundant control sub-circuit 17a largely comprises a programming unit 17b, a level retaining unit 17c and a precharging unit 17d. The programming circuit 17b comprises series combinations of fuse elements F1 to F14 and n-channel enhancement type switching transistors Qn31 to Qn44, and the series combinations are coupled in parallel between an output signal line OUT and a ground voltage line GND. The internal row address bits X1 to X7 are respectively supplied to the gate electrodes of the n-channel enhancement type switching transistors Qn31, Qn33, Qn35, Qn37, Qn39, Qn41 and Qn43, and the other n-channel enhancement type switching transistors Qn32, Qn34, Qn36, Qn38, Qn40, Qn42 and Qn44 are respectively gated by the complementary bits CX1 to CX7. The fuse elements F1 to F14 are selectively broken, and the broken fuse elements are indicative of adjacent two word lines replaced with two redundant word lines RWL1/RWL2 or RWL3/RWL4. The external row address bits of logic "1" level and the external row address bits of logic "0" level are respectively converted into the internal row address bits of logic "1" level and the complementary bits of logic "1" level, respectively. For this reason, the address indicated by the external row address bits R1 to R7 can be compared with the address stored by selectively breaking the fuse elements F1 to F14. Since a broken fuse element associated with an internal address bit of logic "1" corresponds to an external row address bit of logic "1", and a broken fuse element associated with a complementary bit of logic "1" corresponds to an internal row address bit of logic "0", a combination of the broken fuse elements is indicative of an address assigned to two regular word lines For example, if regular word lines coupled with defective memory cells are assigned an address indicated by the external row address bits R1 to R7 of (1011010), the fuse elements F1, F4, F5, F7, F10, F11 and F14 are broken as similar to those of the prior art programming circuit 1.

Upon completion of the fabrication process sequence of the semiconductor memory device, the semiconductor memory device is subjected to a diagnosis to see if or not a defective memory cell is incorporated therein. If defective memory cells are found, adjacent two regular word lines coupled therewith are replaced with the redundant word line pair RWL1/ RWL2 or RWL3/ RWL4, and the address assigned to the two regular word lines is stored in the programming circuit 17b by selectively breaking the fuse elements F1 to F14.

The level retaining unit 17c comprises an inverting circuit 17e coupled at the input node thereof with the output signal line OUT, and a p-channel enhancement type make-up transistor 17f coupled between a positive power voltage line Vcc and the output signal line OUT. The p-channel enhancement type make-up transistor 17f is gated with a first activation signal ACT1 supplied from the inverting circuit 17e, and keeps the output signal line OUT in the high voltage level. The p-channel enhancement type make-up transistor 17f is smaller in current driving capability than the n-channel enhancement type switching transistors Qn31 to Qn44 in view of low power consumption.

The precharging unit 17d comprises an inverting circuit 17g, two NAND gates 17h and 17i, an inverting circuit 17j and a p-channel enhancement type precharging transistor 17k coupled between the positive power voltage line Vcc and the output signal line OUT. The first activation signal ACT1 is supplied to the input node of the inverting circuit 17g, and the output node of the inverting circuit 17g is coupled with an input node of the NAND gate 17h for producing a first enable signal EBL1. The NAND gate 17h is enabled with the first enable signal EBL1, and serves as an inverting circuit on a level retaining signal LH. The output node of the NAND gate 17h is coupled with an input node of the NAND gate 17i, and produces a second enable signal EBL2. The NAND gate 17i is enabled with the second enable signal EBL2, and serves as an inverting circuit on a precharge signal PC for producing a complementary signal CACT of a second activation signal ACT2. The output node of the NAND gate 17i is coupled with the input node of the inverting circuit 17j, and the inverting circuit 17j produces the second activation signal ACT2. The p-channel enhancement type precharging transistor 17k is responsive to the second activation signal ACT2 supplied from the inverting circuit 17j, and charges the output signal line OUT to the high voltage level upon access to a data bit stored in the memory cell array 12. The p-channel enhancement type precharging transistor 17k is larger in current driving capability than the p-channel enhancement type make-up transistor 17f, and the gate electrode thereof is labeled with "G".

Figure 4:
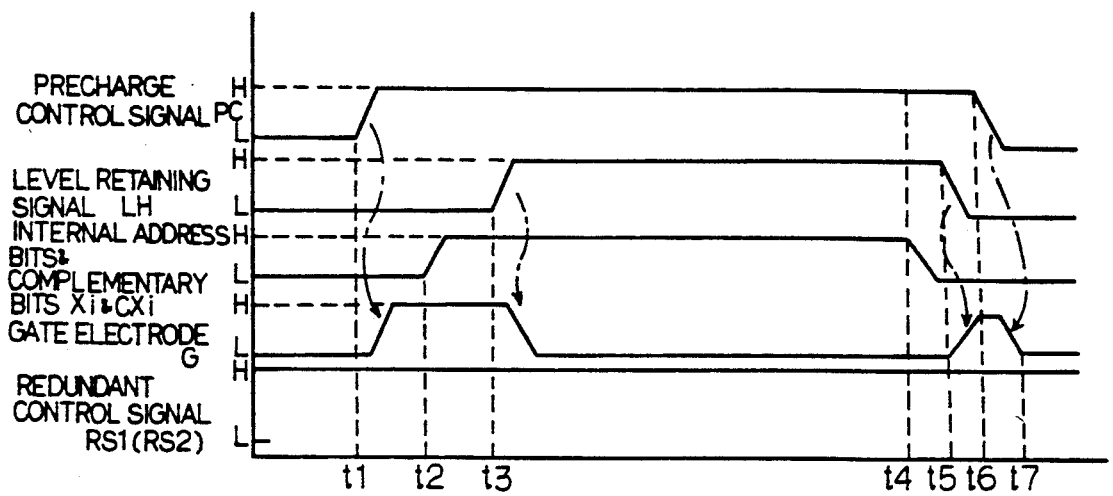
FIG. 4 is a diagram showing the waveforms of essential signals of the redundant control circuit upon consistency of the stored address with an external address.
Figure 5:
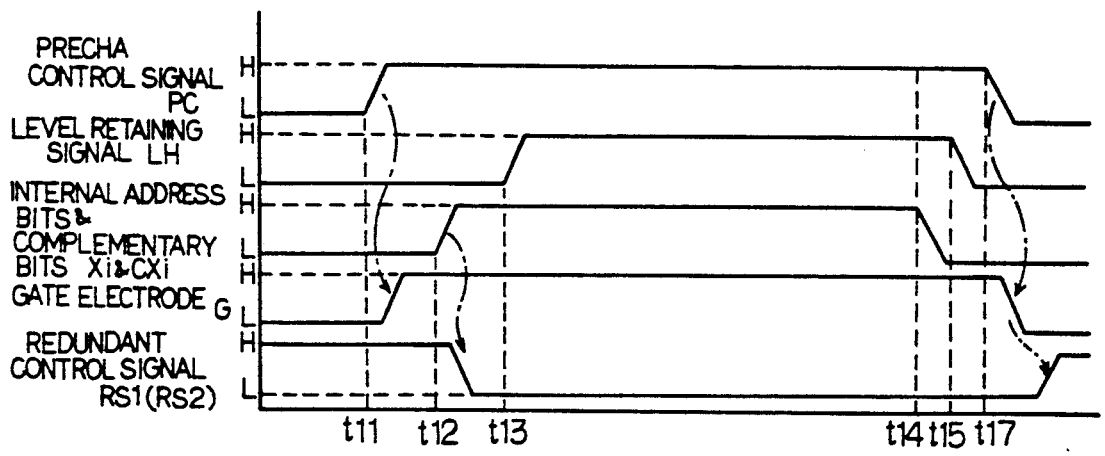
FIG. 5 is a diagram showing the waveforms of the essential signals of the redundant control circuit upon inconsistency of the stored address with an external address.

Description is hereinbelow made on circuit behavior of the semiconductor memory device according to the present invention with reference to FIGS. 4 and 5. In the following description, the high and low voltage levels are assumed to correspond to logic "1" level and logic "0" level, respectively. First, assuming now that an external device accesses a data bit stored in a defective memory cell in the memory cell sub-array 121, the external row address bits R1 to Rx are indicative of the row address assigned to the regular word line coupled with the defective memory cell, and, accordingly, the external row address bits R1 to R7 are indicative of the address assigned to the adjacent two regular word line replaced with the two redundant word lines RWL1 and RWL2. The internal row address bits X1 to Xx and the complementary bits CX1 to CXx are supplied to the row address decoder/regular word line driver unit 141, and the row address decoder/regular word line driver unit 141 becomes ready for driving the word line coupled with the defective memory cell.

While the semiconductor memory device stands idle, a control signal generating circuit (not shown) incorporated in the semiconductor memory device shifts the precharge control signal PC and the level retaining signal LH to the low voltage level, and the output signal line OUT is charged through the p-channel enhancement type precharging transistor 17k to the high voltage level. However, upon access to the data bit stored in the memory cell sub-array 121, the precharge control signal PC is recovered to the high voltage level at time t1, however, the level retaining signal LH still remains in the low voltage level. Since the level retaining signal LH of the low voltage level causes the NAND gate 17h to supply the second enable signal EBL2 of the active high level to the NAND gate 17i regardless of the first enable signal EBL1, the NAND gate 17i shifts the complementary signal CACT to the low voltage level, and, accordingly, the inverting circuit 17j shifts the second activation signal ACT2 to the inactive high voltage level. Then, the current path established in the p-channel enhancement type precharging transistor 17k is closed, and the first activation signal ACT1 allows the p-channel enhancement type make-up transistor 17f to turn on. The address assigned to the adjacent two regular word lines has been already memorized in the programming unit 17b by selectively breaking the fuse elements F1 to F14, and the internal address bits Xi of logic "1" level and the complementary bits CXi of logic "1" level are supplied to the n-channel enhancement type switching transistors associated with the broken fuse elements at time t2. The other n-channel enhancement type switching transistors associated with non-broken fuse elements are turned off, because the internal row address bits and the complementary bits of logic "0" level are supplied to the gate electrodes thereof. For this reason, no current path is established from the output signal line OUT to the ground voltage line GND, and the redundant control signal RS1 of the active high voltage level is supplied to the row address decoder/ first redundant word line driver unit 151. However, the redundant control signals RS2 and RS3 remains in the inactive low voltage level. The redundant control signal RS1 causes the row address decoder/ first redundant word line driver unit 151 to become responsive to the internal address bit Xx, and the row address decoder/ first redundant word line driver unit 151 drives one of the redundant word lines RWL1 and RWL2. Then, the row of the redundant memory cells are coupled with the bit lines DL1 to DLn instead of the row of regular memory cells including the defective memory cells. In other words, the row address decoder/regular word line driver unit 141 never drives the regular word lines WL.

After the output signal line OUT and, accordingly, the redundant control signal RS1 are fixed to the high voltage level, the level retaining signal LH goes up to the high voltage level at time t3. The output signal line OUT of the high voltage level allows the inverting circuit 17e to shift the first activation signal ACT1 to the low voltage level, and the inverting circuit 17g shifts the first enable signal EBL1 to the active high voltage level. With the first enable signal EBL1 of the active high voltage level, the NAND gate 17h is responsive to the level retaining signal of the high voltage level, and shifts the second enable signal EBL2 to the inactive low voltage level. Then, the NAND gate 17i fixes the complementary signal CACT to the high voltage level, and the inverting circuit 17j supplies the second activation signal ACT2 of the active low voltage level to the gate electrode G of the p-channel enhancement type precharging transistor 17k. Then, the p-channel enhancement type precharging transistor 17k turns on again, and a large amount of current is supplemented to the output signal line OUT. In other words, even if the n-channel enhancement type switching transistor associated with the non-broken fuse element turns on due to noise on the ground voltage line GND, the large amount of current keeps the output signal line OUT in the high voltage level. Upon completion of the access, the internal address bits X1 to X7 and the complementary bits CX1 to CX7 are recovered to the low voltage level at time t4, and the level retaining signal LH is also recovered to the low voltage level at time t5. With the level retaining signal LH of the low voltage level, the NAND gate 17h shifts the second enable signal EBL2 to the active high voltage level, and the NAND gate 17i becomes responsive to the precharge control signal PC of the high voltage level. The NAND gate 17i shifts the complementary signal CACT to the low voltage level, and the inverting circuit 17j shifts the second activation signal ACT2 to the inactive high voltage level. The precharge control signal PC is shifted to the low voltage level at time t6, and the NAND gate 17i shifts the complementary signal CACT to the high voltage level. Then, the inverting circuit 17j shifts the second activation signal ACT2 to the active low voltage level at time t7, and the output signal line OUT is charged for the next access.

Subsequently, the external device accesses a data bit stored in an excellent regular memory cell in the memory cell sub-array 121, and the external row address bits R1 to Rx are indicative of the row address assigned to the regular word line coupled with the excellent regular memory cell, and, accordingly, the external row address bits R1 to R7 are indicative of the address assigned to the adjacent two regular word line never replaced with any redundant word line. The internal row address bits X1 to Xx and the complementary bits CX1 to CXx are supplied to the row address decoder/regular word line driver unit 141, and the row address decoder/regular word line driver unit 141 drives the word line coupled with the excellent regular memory cell in the presence of the redundant control signal RS3 of the active level as described hereinlater. Then, the data bits are read out from the row of the regular memory cells to the bit lines DL1 to DLn, and are selectively supplies to the external device.

While the semiconductor memory device stands idle, a control signal generating circuit (not shown) incorporated in the semiconductor memory device shifts the precharge control signal PC and the level retaining signal LH to the low voltage level, and the output signal line OUT is charged through the p-channel enhancement type precharging transistor 17k to the high voltage level. However, upon access to the data bit stored in the memory cell sub-array 121, the precharge control signal PC is recovered to the high voltage level at time t11, however, the level retaining signal LH still remains in the low voltage level. Since the level retaining signal LH of the low voltage level causes the NAND gate 17h to supply the second enable signal EBL2 of the active high level to the NAND gate 17i regardless of the first enable signal EBL1, the NAND gate 17i shifts the complementary signal CACT to the low voltage level, and, accordingly, the inverting circuit 17j shifts the second activation signal ACT2 to the inactive high voltage level. Then, the current path established in the p-channel enhancement type precharging transistor 17k is closed, and the first activation signal ACT1 allows the p-channel enhancement type make-up transistor 17f to turn on. At least one of the internal address bits Xi of logic "1" level and the complementary bits CXi of logic "1" level is supplied to the n-channel enhancement type switching transistors associated with the non-broken fuse element at time t12, and, for this reason, at least one current path is established from the output signal line OUT to the ground voltage line GND. The redundant control signal RS1 remains in the inactive low voltage level, and the redundant control signal RS3 of the active high voltage level is supplied to the row address decoder/regular word line driver unit 141. The redundant control signal RS2 also remains in the inactive low voltage level, and both row address decoder/ redundant word line driver units 151 and 161 are never drive the redundant word lines RWL1 to RWL4.

After the output signal line OUT and, accordingly, the redundant control signal RS1 are decayed to the low voltage level, the level retaining signal LH goes up to the high voltage level at time t13. The output signal line OUT of the low voltage level allows the inverting circuit 17e to shift the first activation signal ACT1 to the inactive high voltage level, and the inverting circuit 17g shifts the first enable signal EBL1 to the inactive low voltage level. With the first enable signal EBL1 of the inactive low voltage level, the NAND gate 17h can not be responsive to the level retaining signal of the high voltage level, and shifts the second enable signal EBL2 to the active high voltage level. Then, the NAND gate 17i becomes responsive to the precharge control signal PC of the high voltage level, and shifts the complementary signal CACT to the low voltage level. The inverting circuit 17j supplies the second activation signal ACT2 of the inactive high voltage level to the gate electrode G of the p-channel enhancement type precharging transistor 17k. Then, the p-channel enhancement type precharging transistor 17k is turned off, and no current is supplied to the output signal line OUT. This results in low current consumption.

Upon completion of the access, the internal address bits X1 to X7 and the complementary bits CX1 to CX7 are recovered to the low voltage level at time t14, and the level retaining signal LH is also recovered to the low voltage level at time t15. With the level retaining signal LH of the low voltage level, the NAND gate 17h shifts the second enable signal EBL2 to the active high voltage level, and the NAND gate 17i becomes responsive to the precharge control signal PC of the high voltage level. The NAND gate 17i keeps the complementary signal CACT in the low voltage level, and the inverting circuit 17j keeps the second activation signal ACT2 in the inactive high voltage level. The precharge control signal PC is shifted to the low voltage level at time t17, and the NAND gate 17i shifts the complementary signal CACT to the high voltage level. Then, the inverting circuit 17j shifts the second activation signal ACT2 to the active low voltage level, and the output signal line OUT is charged for the next access.

As will be appreciate from the foregoing description, the precharging unit 17d allows the p-channel enhancement type precharging transistor 17k to turn on again after the redundant control signal RS1 on the output signal line OUT is fixed to the active high voltage level, and, accordingly, effectively keeps the output signal line OUT against undesirable voltage fluctuation due to noise. As a result, a defective memory cell is never accessed even if the noise takes place, and the semiconductor memory device according to the present invention is reliable against the noise.

Although particular embodiments of the present invention have been shown and described, it will be obvious to those skilled in the art that various changes and modifications may be made without departing from the spirit and scope of the present invention. For example, the present invention is applicable to a data storage section of, for example, a semi-custom-made integrated circuit or a single-chip microcomputer.

What is claimed is:

1. A redundant control circuit associated with a redundant component circuit replaceable with a defective component circuit, comprising:
   a) a programming unit for storing a defective address assigned to said defective component circuit, and operative to compare said defective address with an external address supplied externally thereof to determine whether or not said defective component circuit is selected, said programming unit blocking an output signal line from a discharge line for shifting a redundant control signal on said output signal line to an active level when said external address is consistent with said defective address stored therein, said programming unit providing a current path from said output signal line to said discharge line when said external address is inconsistent with said defective address for shifting said redundant control signal to an inactive level;
   b) a precharging unit operative to precharge said output signal line to said active level before arrival of said external address at said programming unit, and providing an emergency current path to said output signal line for maintaining said output signal line at said active level even if a current path is established between said output signal line and said discharge line in the presence of said external address consistent with said defective address, said precharging unit blocking said emergency current path in the presence of said external address inconsistent with said defective address; and
   c) a make-up unit operative to replenish current to said output signal line when said output signal line is in the inactive level.

2. A redundant control circuit as set forth in claim 1, in which said programming unit comprises a plurality of series combinations of breakable fuse elements and enhancement type switching transistors gated by internal address bits and the complementary bits thereof indicative of said external address, said plurality of series combinations being coupled in parallel between said output signal line and said discharge line.

3. A redundant control circuit as set forth in claim 2, in which said make-up unit comprises c-1) an inverter having an input node coupled with said output signal line for producing a first activation signal, and c-2) an enhancement type make-up transistor coupled between a source of current and said output signal line and responsive to said first activation signal.

4. A redundant control circuit associated with a redundant component circuit replaceable with a defective component circuit, comprising:
   a) a programming unit for storing a defective address assigned to said defective component circuit, and operative to compare said defective address with an external address supplied externally thereof to determine whether or not said defective component circuit is selected, said programming unit blocking an output signal line from a discharge line for shifting a redundant control signal on said output signal line to an active level when said external address is consistent with said defective address stored therein, said programming unit providing a current path from said output signal line to said discharge line when said external address is inconsistent with said defective address for shifting said redundant control signal to an inactive level, said programming unit comprising:
   a-1) a plurality of series combinations of breakable fuse elements and enhancement type switching transistors gated by internal address bits and the complementary bits thereof indicative of said external address, said plurality of series combinations being coupled in parallel between said output signal line and said discharge line;
   b) a precharging unit operative to precharge said output signal line to said active level before arrival of said external address at said programming level even if a current path is established between said output signal line and said discharge line in the presence of said external address consistent with said defective address, said precharging unit comprising:
   b-1) a first inverter supplied with a first activation signal for producing a first enable signal,
   b-2) a first NAND gate supplied with said first enable signal and a level retaining signal for producing a second enable signal,
   b-3) a second MAMD gate supplied with said second enable signal and a precharge control signal for producing a complementary signal of a second activation signal,
   b-4) a second inverter supplied with said complementary signal for producing the second activation signal, and
   b-5) an enhancement type precharging transistor coupled with a source of current to said output signal line and responsive to said second activation signal;
   c) a make-up unit operative to replenish current to said output signal line when said output signal line is in the inactive level, said make-up unit comprising:
   c-1) a third inverter having an input node coupled with said output signal line for producing said first activation signal, and
   c-2) an enhancement type make-up transistor coupled between said source of current and said output signal line and responsive to said first activation signal.

* * * * *